Figure 1:
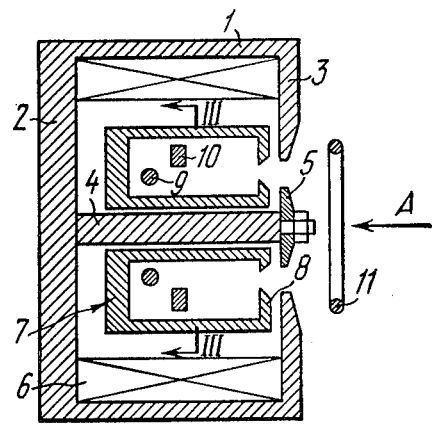

United States Patent

Kovalsky et al.

[11] 4,122,347
[45] Oct. 24, 1978

[54] ION SOURCE

[76] Inventors: Georgy Alexandrovich Kovalsky, ulitsa Stroitelei, 4, korpus 7, kv. 6; Jury Petrovich Maishev, Sumskoi proezd, 21, korpus 1, kv. 43; Jury Akimovich Dmitriev, ulitsa Kakhovka, 21, korpus 1, kv. 10, all of Moscow, U.S.S.R.

[21] Appl. No.: 779,524

[22] Filed: Mar. 21, 1977

[51] Int. Cl.² .............................................. H01J 27/00
[52] U.S. Cl. .................................. 250/423 R; 250/427
[58] Field of Search ................. 250/423 R, 426, 427, 250/396 R, 396 ML; 313/243, 153, 359, 362

[56] References Cited

U.S. PATENT DOCUMENTS

| 2,672,560 | 3/1954 | Berry | 250/427 |
|---|---|---|---|
| 3,513,351 | 5/1970 | Kelly | 250/426 |
| 3,610,985 | 10/1971 | Newbury et al. | 250/427 |

Primary Examiner—Alfred E. Smith
Assistant Examiner—B. C. Anderson
Attorney, Agent, or Firm—Lackenbach, Lilling & Siegel

[57] ABSTRACT

A source of a tubular beam of ions comprising a cylindrical shell with one butt end having an axial hole in it and the other butt end solid. It is provided with a rod having one end fixed to the solid butt end of the cylindrical shell and arranged coaxially to the latter. The free end of the rod carries a disc placed in the axial hole of the butt end of the cylindrical shell so as to obtain a circular gap confined by the side wall of the hole. A hollow annular shell is arranged coaxially within the cylindrical shell so that a circular gap made in the butt end of the annular shell faces the circular gap in the butt end of the cylindrical shell. An annular cathode and an anode are arranged coaxially inside the annular shell. A thermoelectronic cathode is placed outside the cylindrical shell near to its butt end with the circular gap. An electromagnet coil is arranged coaxially inside the cylindrical shell. A device for ion acceleration is placed on the path of emission of the ions. The cylindrical shell and its butt ends, and the rod are made of magnetically soft material, whereas the annular shell is made of nonmagnetic material.

7 Claims, 5 Drawing Figures

ION SOURCE

The present invention relates to devices used for obtaining a beam of ions and, in particular, to ion source producing an intensive axially symmetrical beam of ions.

It is most advantageous to employ the present invention for obtaining thin films of various materials by ion spraying and, also, for cleaning surfaces by ion pickling.

The present invention may also serve as an injector of charged particles for other purposes.

Known at present is an ion source incorporating a hollow cylindrical shell with one end solid and with a hole in the butt of the opposite end. The shell contains a coaxially arranged rod with one of its ends fixed to the solid butt of the shell. The other end of the rod is placed in the hole of the opposite butt end so as to obtain a circular gap between the side surface of the rod and the butt hole for emission of ions. The shell and rod are made of magnetically soft materials.

The rod carries an electromagnet coil arranged so that the magnetic field set up by the coil makes the free end of the rod and the wall of the butt hole of opposite polarity, i.e., so as to obtain a radial magnetic field within the circular gap.

An annular electrode is placed coaxially on the rod inside the shell near the butt hole so as to face the circular gap.

The ion source is connected to a voltage applied so that the shell and rod are the cathode and the annular electrode is the anode of the device.

The shell is filled with an ion-producing gas, say, with argon.

Application of a voltage of about 10 kV to the ion source initiates a cold discharge across the anode and cathode of the device. The ions produced by the discharge are directed by the electromagnetic field towards the cathode and emitted through the circular gap.

The source described above allows to obtain an ion beam current up to 10 A at a gas pressure of $10^{-4}$ to $10^{-5}$ mm Hg and an applied voltage of up to 10 kV.

A major disadvantage of the given source is the wide scatter of the ion energy (practically from zero to the value of the applied voltage), thus making it rather difficult to produce, control and transfer the ions to the surface being processed.

The energy scatter is due to the equiprobable ionization of the gas at any point of the accelerating gap between the cathode and anode. As a result, the energy acquired by the ions depends on the difference between the potential at the point of their production and the cathode potential. The direction of emission of the ions from the accelerating gap also depends on the actual point of production of the ions, thus causing a considerable expansion of the ion beam.

There is also an ion source of the following construction. This source has a hollow cylindrical shell with one butt end solid and a hole in the butt of the other end. The shell contains a hollow cylindrical yoke with one end fixed coaxially to the solid butt of the shell. The free end of the yoke carries a disc placed within the butt hole so as to obtain a circular gap between the side surface of the disc and the wall of the hole. The shell also contains two electromagnet coils, one embracing the yoke and the other fixed to the inner side wall of the shell.

The shell, yoke and disc are made of magnetically soft material.

An annular cathode is arranged coaxially inside the shell near to its solid butt end and opposite the circular gap. The cathode is surrounded by a shield of magnetically soft material. The cathode shield is fixed to the solid butt end of the shell. The shield has a circular slit for ion emission positioned opposite the circular gap between the side surface of the disc and the wall of the butt end hole.

The source has an electromagnet coil fixed to the side surface of the shell that produces a magnetic field embracing the open butt end, the side surface of the shell, part of the solid butt end and part of the cathode shield and sets up an axial magnetic field within the gap between the cathode shield and the edge of the open butt end.

There is also an electromagnet coil fixed to the rod that produces a magnetic field embracing the disc rod, part of the solid butt end and part of the cathode shield and sets up an axial magnetic field within the gap between the cathode shield and the edge of the disc.

The magnetic field of the two coils is set up so that the magnetic lines of force leave the open butt end and the yoke disc and enter the cathode shield.

A flat annular anode with a circular slit is positioned between the open butt end and the cathode shield coaxially to the shell. The circular slit is placed opposite the gap between the butt end hole and the disc.

An accelerating electrode is placed outside the shell at the open butt end. The accelerating electrode is in the form of a disc of non-magnetic material with a circular slit coaxial to the shell and placed opposite the gap between the open butt end and the disc.

A retarding electrode is provided at some distance from the accelerating electrode in the direction of flow of the stream of ions. The retarding electrode is similar to the accelerating electrode and has a circular slit positioned opposite that of the accelerating electrode. The shell is filled with an ion-producing gas, say, with argon.

The ion source operates according to the following principle. The electrons emitted from the hot cathode surface collide in the course of their travel with the molecules of the working gas and ionize it. As a result, a discharge is initiated across the cathode and anode of the source. The resulting plasma diffuses along the magnetic field set up by the two coils towards the circular gap between the open butt end and the disc. At application of a sufficiently high voltage across the shell and the accelerating electrode, ions are drawn out of the border of the plasma, accelerated and then slowed down to the required energy level and formed into a beam by the voltage applied across the accelerating and retarding electrodes.

The boundary of the plasma is set according to the value of the voltage applied across the shell and the accelerating electrode. The density of the drawn current is determined by the applied voltage and the distance between the boundary of the plasma and the accelerating electrode. Besides that, the density of the current passing through the hole in the accelerating electrode is limited by the beam's own spatial charge that tends to disperse the ion beam and, consequently, makes it more difficult to obtain a ion beam of high intensify, this being an essential disadvantage of the ion source described above.

Moreover, the production and formation of the ion beam is accomplished by a multi-electrode system that gives rise to ion current losses across the electrodes.

Other disadvantages of the ion source described above are its sophisticated constructional features, large size, heavy weight and inconvenience in service (due to the difficulty of adjustment and the large number of sources of power supply).

Another known ion source has a hollow cylindrical shell with a solidly closed end that houses a coaxial hollow internal cylinder with one end fixed to the solid butt end of the shell. The shell and internal cylinder are arranged so that their ends opposite to the butt lie on the same plane. Those ends of the shell and internal cylinder carry two flat rings that serve as an anticathode. The rings are positioned concentrically on the same plane and coaxially to the shell so that the gap between them is in the space between the shell and the internal cylinder. That space is the discharge chamber of the source, and the gap serves for drawing the ions out of the plasma produced in the chamber. Two cylinders that serve as the anode are arranged concentrically and coaxially to the shell at both sides of an annular cathode placed opposite the gap between the rings at the flat butt end of the discharge chamber.

Two rings that serve as the accelerating electrode with a circular gap opposite that of the anti-cathode are fixed parallel to the plane of the latter outside the discharge chamber at the anti-cathode end by means of two hollow cylindrical insulators to the ends of the shell and internal cylinder holding the anti-cathode rings.

The discharge chamber is filled with the working gas (for instance, argon). The source of ions is positioned in the magnetic field so that the magnetic lines of force are aligned with the shell axis.

The electrons leaving the hot cathode surface ionize the working gas (argon) in the course of their travel before they reach the anode. In consequence, a gas discharge is set up within the discharge chamber. The resulting plasma moves by diffusion along the magnetic lines of force towards the anti-cathode. At application of a corresponding voltage across the anti-cathode and the accelerating electrode, the ions of the working gas are extracted from the surface of the plasma, accelerated and formed into a beam through the circular gap in the anti-cathode. In the course of that process, some of the ions reach the accelerating electrode and knock out secondary electrons that are accelerated in the direction opposite to the flow of ions, bombard the surface of the discharge chamber, cathode and anode, thus heating and destroying the latter. The passage of the ion beam through the residual gas ionizes the latter and produces electrons similar to the secondary electrons that reach the surface of the discharge chamber and its components without hindrance, heat and destroy them, this being a serious disadvantage of the above-described source. Other disadvantages are that the density of the current drawn from the boundary of the plasma depends upon the value of the applied voltage and the distance between the boundary of the plasma and the accelerating electrode, while the boundary of the plasma is set according to the value of the applied voltage.

Moreover, the density of the current passing through the accelerating electrode hole is limited by the beam's own spatial charge.

The beam's own spatial charge tends to disperse the ion beam and, consequently, makes it more difficult to obtain a ion beam of high intensity.

Known also is an ion source having a hollow cylindrical shell with one butt end solid, whereas the other end has a round hole in it. The shell contains a rod coaxial to the shell and fixed by one of its ends to the solid butt end of the shell.

The other end of the rod is positioned in the butt end hole so as to obtain a circular gap between the surface of the rod and the hole wall for emission of ions.

The shell and rod are made of magnetically soft materials.

The inner side surface of the shell carries an electromagnet coil arranged so that its magnetic field makes the free end of the rod and the hole wall of opposite polarity, i.e., sets up a radial magnetic field within the circular gap.

A hollow cylindrical anode is placed inside the shell coaxially around the rod.

An annular cathode is fitted coaxially outside the shell at the butt end with the hole in it.

An accelerating electrode is placed at some distance from the cathode in the direction of travel of the ion beam. The accelerating electrode is in the form of a disc with a hole in it, the hole being coaxial to the shell and positioned opposite the hole in the butt end of the shell.

The shell is filled with a working gas, say, argon. The ion source operates according to the following principle. The electrons leaving the hot cathode surface move along the electric field lines of force inside the shell towards the anode. As a result, the gas within the shell becomes ionized. The plasma formed in that way fills the inner space of the shell. At application of a high voltage up to 10 kV across the shell and accelerating electrode, the ions are accelerated and formed into a beam.

The ion source described above has several inherent disadvantages. The ion beam of the source is of rather low intensity since the beam's own spatial charge makes it more difficult to draw the ions from the surface and does not allow to increase the density of the ion current. The beam's own spatial charge also makes it more difficult to form the ion beam and gives rise to ion current losses at the accelerating electrode.

The secondary electrons resulting from the bombardment of the accelerating electrode by ions gradually destructs the open butt end.

The accelerating electrode is in the direct vicinity of the region where the plasma is produced and hence its entire surface is subject to intensive ion bombardment that raises the temperature of the accelerating electrode and destructs it.

It is an object of the present invention to eliminate the above-said disadvantages of known ion sources.

It is another object of the present invention to obtain a monoenergetic directed ion beam of high intensity.

It is a still further object of the present invention to reduce the weight and size of the ion source.

It is yet another object of the present invention to raise the efficiency of the ion source.

One more object of the present invention is to make it possible to neutralize the neutralize the effect of the ion beam current on the target.

It is also an object of the present invention to develop an ion source wherein the intensity of the ion beam is increased by compensating the beam's own spatial charge at the instant of its formation.

Said objects are accomplished by the development of a source of a tubular beam of ions comprising an annular cathode and anode arranged inside a cylindrical shell with one butt end having an axial hole and the second butt end solid, and a coaxially arranged rod with one end fixed to the shell solid butt end, while the second end of the rod carries a disc placed in the axial hole of the other butt end so as to obtain a circular gap confined by the hole side wall for the emission of ions, the shell containing a coaxially arranged electromagnet coil, said source also being provided with a device for accelerating the ions in accordance with the present invention, whereby the cylindrical shell contains an electrically isolated and coaxially arranged hollow annular shell embracing the annular cathode and anode, the annular shell having a circular gap in its butt end facing the circular gap in the butt end of the cylindrical shell and there being a coaxially arranged thermoelectronic cathode outside the cylindrical shell near its butt end with the circular gap, the cylindrical shell and its butt ends, as well as the rod and disc being made of a magnetically soft material, whereas the annular shell is made of a non-magnetic material.

The employment of an annular shell of non-magnetic material embracing the cathode and anode within the cylindrical shell makes it possible to obtain an isolated discharge chamber and raise the degree of ionization of the working gas, i.e., to increase the concentration of the plasma and, consequently, the density of the ion current drawn from the source.

The use of a cylindrical shell butt end and a rod and disc of magnetic material allows to obtain a magnetic field in the ion-beam producing and forming region with magnetic field lines of force perpendicular to the electric field lines of force. This makes it possible to set up a drift of electrons within the beam producing and forming region and, hence, to obtain a flow of electrons compensating the beam's own spatial charge.

The provision of a thermoelectronic cathode in front of the cylindrical shell butt end allows a flow of electrons compensating the beam's own spatial charge.

Besides, the use of the thermoelectronic cathode makes it possible to neutralize the effect of the ion beam current on the target.

It is highly desirable that the rod cross-section and edges of the cylindrical shell butt end hole and disc be of such a shape as to make the lines of force of the magnetic field produced by the electromagnet coil between the open butt ends of the cylindrical shell and annular shell coincide with the equipotential surfaces of the electric field set up on application of voltage to the annular shell.

By making the rod cross-section and the cylindrical and annular shell hole edges of such a shape that the magnetic field lines coincide with the equipotential surfaces of the electric field, it becomes possible to create most favourable conditions for compensation of the ion beam's own spatial charge.

Figure 2:
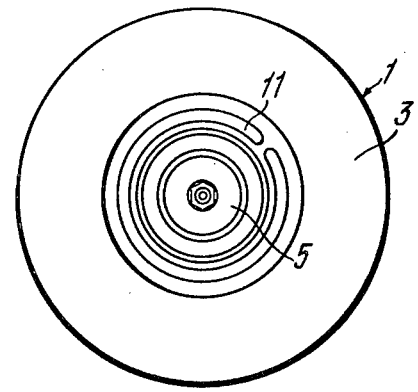
Figure 3:
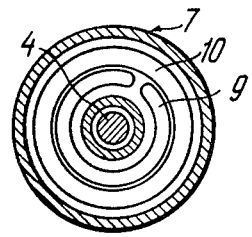
Figure 4:
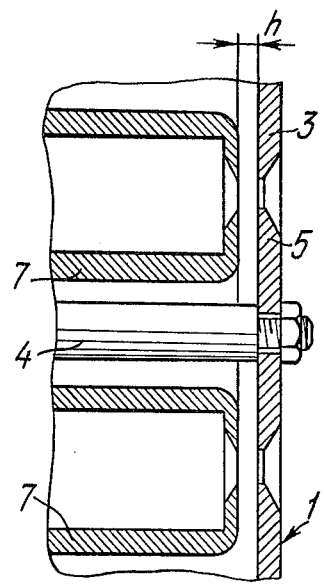
Figure 5:
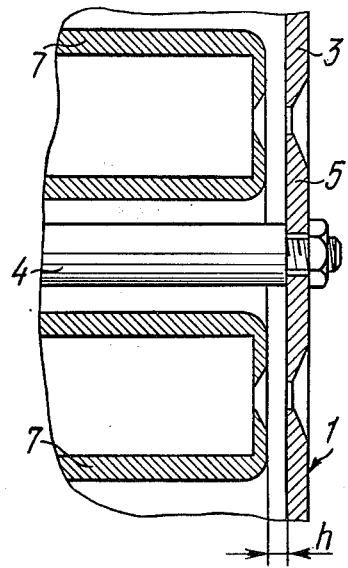

The present invention will further be described by way of example with reference to the following drawings, wherein:

FIG. 1 shows a cross-sectional view of the proposed ion source;

FIG. 2 presents a view of the proposed ion source along arrow A;

FIG. 3 presents a view of the proposed ion source along arrow III;

FIG. 4 presents a version of the shape of the edges of the annular shell hole and the edges of the cylindrical shell butt end hole and the disc;

FIG. 5 presents a version of the shape of the edges of the annular shell hole and the edges of the cylindrical shell butt end hole and the disc.

The proposed source of a tubular beam of ions comprises a hollow cylindrical shell 1 (FIGS. 1, 2 and 3) with one butt end 2 solid, whereas the second butt end 3 has a hole in it. The cylindrical shell 1 contains a rod 4 placed coaxially to the cylindrical shell 1 and with one of its ends fixed to the solid butt end 2. The free end of the rod 4 carries a disc 5 positioned in the plane of the open butt end 3 so as to obtain a circular gap for the emission of ions between the side surface of the disc 5 and the periphery or edge defining the hole in the wall of the butt end 3.

The cylindrical shell 1, rod 4 and disc 5 are made of magnetically soft material, say, of steel containing not more than 0.1 percent of carbon, not more than 0.2 percent of silicon and not more than 0.4 percent of manganese.

The cylindrical shell 1 houses a coaxially arranged electromagnet coil 6 fixed to the side surface of the shell so that the magnetic field set up by the coil 6 makes the side surface of the disc 5 and the wall of the hole in the butt end 3 of opposite magnetic polarity, i.e., so as to obtain a radial magnetic field within the circular gap between the edges of the hole in the butt end 3 and the disc 5.

The rod is of such a cross-section that an axial magnetic field is set up within the cylindrical shell 1 together with the radial magnetic field between the edges of the hole in the butt end 3 and the disc 5. For instance, at a cross-section area of the rod 4 ranging from 80 to 120 $mm^2$, an axial magnetic field of 300 to 500 oersteds is set up within the cylindrical shell 1 and a radial mangetic field of 1000 to 1500 oersteds is set up within the circular gap.

An annular shell 7 with a circular gap in its butt end 8 positioned opposite the circular gap of the butt end 3 is arranged inside the cylindrical shell 1 coaxially to the rod 4. The annular shell 7 is made of a non-magnetic material, say, of copper or molibdenum. The annular shell 7 is isolated electrically from the cylindrical shell 1 and the electromagnet coil 6.

An annular cathode 9 made, for instance, of a dia. 2 mm tungsten conductor is placed inside the annular shell 7 within the region of the uniform magnetic field set up by the electromagnet coil 6 at approximately an equal distance from the butt ends of the cylindrical shell 1 coaxially to the latter. The cathode 9 is arranged so that the lines of force of the axial magnetic field produced by the electromagnet coil 6 pass through the cathode 9 and the circular gap in the butt 8 of the annular shell 7.

An annular anode 10 is placed inside the annular shell 7 between the cathode 9 and the butt end 8 of the annular shell 7 coaxially to the cylindrical shell 1. The anode 10 is placed in the vicinity of the cathode 9 so as to lessen the ignition value and the gas discharge voltage applied across the cathode 9 and the anode 10.

The anode 10 is made of a slightly greater diameter than the cathode 9, the inner diameter of the anode 10 being somewhat larger than the outer diameter of the cathode 9. In order to lengthen the path of the electrons travelling from the cathode 9 to the anode 10 and to increase the degree of ionization.

An annular thermoelectronic cathode 11 is placed in front of the butt end 3 and hole of the cylindrical shell 1 outside and coaxially to the latter. The thermoelectronic cathode 11 serves to shape the oncoming stream of electrons compensating the ion beam's own spatial charge in the ion beam formation region. Therefore, the thermoelectronic cathode 11 should be capable of emitting a sufficient amount of electrons and is correspondingly made of any suitable material, for instance, tungsten or tantalum.

The thermoelectronic cathode 11 is placed in the vicinity of the butt end 3 of the cylindrical shell 1. The spacing of the thermoelectronic cathode 11 and butt end 3 of the cylindrical shell 1 depends on the field strength of the radial magnetic field set up by the electromagnet coil 6 in the vicinity of the butt end 3 of the cylindrical shell 1. The spacing increases with increasing field strength. In the case of the described embodiment of the ion source, the spacing is within 25 to 40 mm at a radial field strength of 1000 to 1500 oersteds. Such a spacing excludes any effect of the stray fields of the electromagnet coil 6 on the electrons emitted from the surface of the thermoelectric cathode 11. The diameter of the thermoelectronic cathode is selected so that the ion beam does not touch it in the course of passage through the cathode; otherwise, the thermoelectronic cathode 11 would be subject to ion bombardment and, as a result, to rapid wear. The diameter of the thermoelectronic cathode 11 should practically exceed that of the hole in the butt end 3 of the cylindrical shell 1 by about 10 to 15 mm.

When the annular shell 7 is connected to the positive ("+") terminal and the cylindrical shell 1 to the negative ("−") terminal of the high-voltage source, the open butt end 3 and disc 5 serve as a means of drawing and accelerating the ions produced within the annular shell 7, i.e., serve as an accelerating electrode.

The shape of the accelerating electrode and the annular shell 7, as well as their position in respect to each other are selected so that the lines of force of the radial magnetic field set up by the electromagnet coil 6 coincide with the equipotential surfaces of the electric field within the gap (referred to as the accelerating gap) between the annular shell 7 and the accelerating electrode. As a result, a mutually perpendicular electric and magnetic field is obtained within the accelerating gap. By varying the shape and mutual position of the annular shell 7 and the accelerating electrode, it becomes possible to focus the ion beam into a spot about 5 to 10 mm in diameter, or direct it along the axis of the ion source as a tubular beam over a distance up to 600 mm and longer or, alternatively, defocus it over a larger area.

The optimum shape of the accelerating electrode and the annular shell 7 and their mutual arrangement depend on the value of the high voltage and may be as depicted in FIGS. 4 and 5.

At a voltage across the accelerating electrode (i.e., the butt end 3 of the cylindrical shell 1 and the disc 5) and the annular shell 7 of 0.3 to 5 kV, the shape of the edges of the hole in the butt end 3 of the cylindrical shell 1 and the disc 5, as well as the shape of the edges of the hole in the annular shell 7 are as shown in FIG. 4. In this case, the magnitude $h$ of the gap between the annular shell 7 and the accelerating electrode is within 1.0 to 2.5 mm limits.

At a voltage across the accelerating electrode and the annular shell 7 of 6 to 10 kV, the shape of the edges of the hole in the butt end 3 of the cylindrical shell 1 and the disc 5, as well as the shape of the edges of the hole in the annular shell 7 are as shown in FIG. 5. In this case, the magnitude $h$ of the gap between the annular shell 7 and the accelerating electrode lies within 3 to 3.5 mm limits.

The annular shell 7 is filled for operation of the ion source with a working gas (say, argon) that produces the ions.

The ion source operates according to the following principle. The ion source is connected to a working vacuum chamber (not shown in FIG. 1) that is evacuated by, say, a conventional oil-diffusion vacuum pump. The ion source is connected to a water-cooling system (not shown in the drawing), sources of voltage supply and a system of working gas (say, argon) supply (not shown in the drawing). A vacuum of about $10^{-5}$ mm Hg is set up in the vacuum chamber.

Then the cathode 9 is heated by a direct current of 10 A to the temperature of emission. The electromagnet coil 6 is connected to the source of voltage supply and the ion source is filled with argon with the aid of an inleakage unit (not shown in the drawing). The flow of argon is increased until the pressure within the vacuum chamber attains 1 to $2.10^{-4}$ mm Hg with the effective evacuation capacity of 1,000 l/sec. This being achieved, the anode 10 is connected to the source of supply and a voltage of 40 to 70V is applied across the cathode 9 and the anode 10. This initiates an arc discharge inside the annular shell 7, the discharge voltage drops spontaneously and an arc current appears that has to be increased to 20–30A by raising the discharge voltage.

The plasma produced inside the annular shell 7 diffuses along the lines of force of the magnetic field into the region of the circular gap of the annular shell 7. An accelerating voltage is applied across the annular shell 7 and the cylindrical shell 1. The gap in the annular shell 7 becomes the boundary of the plasma from which the ions are drawn by the electric field.

The boundary of the plasma is established according to the value of the voltage applied across the annular shell 7 and the accelerating electrode. The density of the ion current drawn from the boundary of the plasma is determined by the value of the applied voltage and the distance between the plasma boundary and the accelerating electrode. Besides, the density of the current flowing through the circular gap of the accelerating electrode is limited by the beam's own spatial charge that tends to disperse the ion beam. The ion current drawn at the same distance between the accelerating electrode and the plasma boundary can be increased by increasing the concentration of the plasma and lessening the effect of the beam's own spatial charge that diverges the ion beam within the gap between the plasma boundary and the accelerating electrode.

The beam's own spatial charge is neutralized within the accelerating gap by introducing a flow of electrons from the thermoelectronic cathode 11 into the accelerating gap.

To this end, the thermoelectronic cathode 11 is connected to the source of supply and heated by a direct current of 10 to 15A to its temperature of emission.

The electrons emitted from the hot surface of the thermoelectronic cathode 11 are accelerated by the applied voltage in the direction opposite to that of the flow of ion current.

These electrons get into the gap between the annular shell 7 and the accelerating electrode and are kept there due to the joint effect of the mutually perpendicular electric and radial magnetic fields. These electrons drift along cardioid paths within the circular gap of the annular shell 7 and produce a negative spatial charge that compensates the beam's own spatial charge.

For effective retention of the electrons, the lines of force of the radial magnetic field produced by the electromagnet coil 6 should coincide with the equipotential surfaces of the electric field within the accelerating gap.

The magnetic field strength within the circular gap of the accelerating electrode exceeds a certain critical value that depends on the value of the accelerating voltage and the magnitude of the accelerating gap. In this case, the electrons pass solely near the ion-emitting surface, i.e., the boundary of the plasma, bypass the annular shell 7 and reach electrodes that are at the same potential as the thermoelectronic cathode 11.

During the passage of the ion beam through the residual gas, the latter becomes ionized and the electrons released in that process are made to drift by the electric field of the ion beam along the latter. In consequence, those electrons get into the accelerating gap and partially compensate the beam's own spatial charge in the same way as the electrons emitted from the hot surface of the thermoelectronic cathode 11.

It should be noted that when the ion source operates at a pressure within the vacuum chamber of $3.10^{-4}$ to $1.10^{-5}$ mm Hg, the electrons produced at passage of the ion beam through the residual gas are sufficient to compensate the beam's own spatial charge within the accelerating gap and make it possible to obtain a directed beam of argon ions of 0.2A at an energy of 1 keV to 0.5A at an energy of 5 keV. Further reduction of the pressure leads to a deficit in electrons that can only be made up for by means of the electrons emitted from the surface of the thermoelectronic cathode 11.

In addition, the proposed ion source allows to neutralize the effect of the ion beam current on the processed surface (target). To neutralize the effect of the beam's own spatial charge current on the target, it is necessary to maintain the thermoelectronic cathode 11 at a negative voltage bias of 30 to 40 V in respect to the accelerating electrode or, alternatively, to select the cross-sectional area and length of the conductor of the thermoelectronic cathode 11 so that the voltage drop across the thermoelectronic cathode 11 at the temperature of emission amounts to 30–40 V with the positive ("+") terminal of the source of voltage supply of the thermoelectronic cathode 11 connected to the accelerating electrode.

Thus, an advantage of the proposed ion source is that it allows to obtain a monoenergetic ion beam of high intensity and, besides, that, provides for neutralization of the effect of the ion beam current on the target.

What is claimed is:

1. A tubular ion beam source, comprising: a cylindrical shell of a magnetically soft material having axially opposite butt ends, one of said butt ends being provided with an axial hole and the other being solid; a rod having one of its ends made of a magnetically soft material, said rod being secured rigidly to said solid butt end of said cylindrical shell coaxially thereto; a disc made of a magnetically soft material, said disc being secured to the free end of said rod and disposed in said axial hole of said butt end of said cylindrical shell to form a circular gap with the periphery or edge of said axial hole; an electromagnetic coil placed inside said cylindrical shell coaxially thereto to produce, when energized with a voltage, a magnetic field whose magnetic lines of force in the area of said rod are directed parallel thereto and, in the area of said circular gap, directed normally to the axis of said cylindrical shell; a hollow annular shell of a non-magnetic material disposed coaxially in said cylindrical shell and electrically insulated therefrom and adapted to form an electric discharge therein, said hollow annular shell having a circular gap provided in its butt end facing said circular gap of said butt end of said cylindrical shell to draw ions produced during discharge; an annular cathode disposed coaxially inside said hollow annular shell and adapted to be heated to emit electrons; an annular anode disposed coaxially inside said hollow annular shell; a thermoelectronic cathode placed outside said cylindrical shell close to said butt end thereof having said axial hole and adapted to be heated to emit electrons; means to draw and accelerate ions produced in said hollow annular shell, said means being arranged at the outlet of the ions; a voltage supply source to generate an electric field between said butt ends which have said axial holes in said cylindrical shell and said hollow annular shell.

2. A tubular ion beam source as claimed in claim 1, wherein the cross-section of said rod and the configuration of the edges of said hole provided in said butt end of said cylindrical shell and the edge of said disc are dimensioned such that the lines of force of the magnetic field produced by said electromagnet coil between said butt ends having said axial holes provided in said cylindrical shell and said hollow annular shell coincide with the equipotential surfaces of an electric field produced when voltage is applied to said annular shell.

3. A tubular ion beam source as claimed in claim 1, wherein said annular cathode is axially disposed approximately equidistantly from said butt ends of said cylindrical shell.

4. A tubular ion beam source as claimed in claim 1, wherein said annular anode is disposed in the vicinity of said annular cathode.

5. A tubular ion beam source as claimed in claim 1, wherein the diameter of said annular anode is greater than the diameter of said annular cathode.

6. A tubular ion beam source as claimed in claim 5, wherein the inner diameter of said annular anode is greater than the outer diameter of said annular cathode.

7. A tubular ion beam source as claimed in claim 5, wherein said diameters are substantially equal to each other.

* * * * *